United States Patent
Rhee et al.

(10) Patent No.: US 10,594,296 B2
(45) Date of Patent: Mar. 17, 2020

(54) MULTI RESONATOR SYSTEM

(71) Applicant: SAMSUNG ELECTRONICS CO., LTD., Suwon-si (KR)

(72) Inventors: Choongho Rhee, Seoul (KR); Sungchan Kang, Hwaseong-si (KR); Cheheung Kim, Yongin-si (KR); Sangha Park, Seoul (KR); Yongseop Yoon, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 398 days.

(21) Appl. No.: 15/492,494

(22) Filed: Apr. 20, 2017

(65) Prior Publication Data
US 2018/0131347 A1 May 10, 2018

(30) Foreign Application Priority Data
Nov. 9, 2016 (KR) .................. 10-2016-0149094

(51) Int. Cl.
*H01L 41/08* (2006.01)
*H03H 9/02* (2006.01)
*H03H 9/24* (2006.01)
*H01L 41/083* (2006.01)
*H01L 41/113* (2006.01)
*H01L 41/187* (2006.01)

(52) U.S. Cl.
CPC ......... *H03H 9/2405* (2013.01); *H01L 41/083* (2013.01); *H01L 41/1132* (2013.01); *H01L 41/187* (2013.01); *H03H 9/02259* (2013.01)

(58) Field of Classification Search
CPC ............ H01L 41/1132; H03H 9/02259; H03H 9/2405

USPC ................................................... 310/330–332
See application file for complete search history.

(56) References Cited

U.S. PATENT DOCUMENTS

| | | | |
|---|---|---|---|
| 4,742,263 A * | 5/1988 | Harnden, Jr. | H01L 41/094 200/181 |
| 5,856,722 A | 1/1999 | Haronian et al. | |
| 6,223,601 B1 | 5/2001 | Harada et al. | |
| 7,444,877 B2 | 11/2008 | Li et al. | |
| 8,143,765 B1 * | 3/2012 | Yegingil | H02N 2/186 310/330 |
| 9,479,884 B2 * | 10/2016 | Kim | H04R 17/025 |
| 2008/0074002 A1 * | 3/2008 | Priya | H01L 41/1136 310/339 |

(Continued)

FOREIGN PATENT DOCUMENTS

JP 2004-85419 A 3/2004

OTHER PUBLICATIONS

Lee et al., "Tuning the Quality Factor of Microcantilever using hydrodynamic coupling of micro structures", Jun. 21-25 2009, 4 pages total, p. 704-p. 707, IEEE, Denver, CO, USA.

*Primary Examiner* — J. San Martin
(74) *Attorney, Agent, or Firm* — Sughrue Mion, PLLC

(57) ABSTRACT

A multi resonator system is provided including a support substrate and a plurality of multi resonators. Each of the plurality of multi resonators includes a plurality of resonators, and one end of each of the plurality of resonators is fixed to the support substrate. Center frequencies of different ones of the plurality of multi resonators are different from each other, and the plurality of resonators within each individual multi resonator all have a same center frequency.

19 Claims, 7 Drawing Sheets

(56) References Cited

U.S. PATENT DOCUMENTS

2016/0050506 A1  2/2016  Kim

* cited by examiner

MULTI RESONATOR SYSTEM

CROSS-REFERENCE TO RELATED APPLICATION

This application claims priority from Korean Patent Application No. 10-2016-0149094, filed on Nov. 9, 2016, in the Korean Intellectual Property Office, the disclosure of which is incorporated herein in its entirety by reference.

BACKGROUND

1. Field

Apparatuses and systems consistent with exemplary embodiments relate to multi resonator systems including a plurality of multi resonators.

2. Description of the Related Art

Resonators are used to analyze audio or vibration spectrums. Thus, they may be used to analyze vibration information for situation recognition, speech recognition, speaker recognition, or the like in cell phones, computers, home appliances, vehicles, or smart home environments, or may be mounted on home appliances, vehicles, buildings, or the like.

Generally, frequency domain information of an audio signal is acquired by making an audio signal, input to a microphone having wideband characteristics, pass through an analog-to-digital converter (ADC) and then applying a Fourier-transform to the converted signal. Such a frequency information acquisition method requires a heavy load in terms of the computational amount required for the Fourier transform and there is a trade-off relationship between the frequency resolution and time resolution. Thus, it is difficult to improve the resolutions of both time information and frequency information.

SUMMARY

One or more exemplary embodiments may provide multi resonator systems with an improved resonance displacement at a center frequency.

One or more exemplary embodiments may provide multi resonator systems with a reduced crosstalk effect caused by coupling of adjacent different resonators.

One or more exemplary embodiments may provide multi resonator systems capable of obtaining an increased output signal at a center frequency of each of a plurality of multi resonators.

Additional exemplary aspects and advantages will be set forth in part in the description which follows and, in part, will be apparent from the description, or may be learned by practice of the presented exemplary embodiments.

According to an aspect of an exemplary embodiment, a multi resonator system includes: a support substrate; and a plurality of multi resonators, and center frequencies of the plurality of multi resonators are different from each other, wherein each of the plurality of multi resonators includes a plurality of resonators, and one end of each of the plurality of resonators is fixed to the support substrate. Within each of the multi resonators, the plurality of resonators have a same center frequency.

Each of the plurality of resonators may include: a fixer fixed to the support substrate; a driver configured to be driven in response to an audio signal; and a sensor configured to sense a movement of the driver.

Each of the plurality of resonators may further include a mass body.

The plurality of resonators may be arranged in a substantially flat plane without overlapping each other.

The plurality of multi resonators may include a first multi resonator, a second multi resonator, and a third multi resonator, wherein the first multi resonator includes a plurality of first resonators, the second multi resonator includes a plurality of second resonators, and the third multi resonator includes a plurality of third resonators, and wherein a first center frequency of the plurality of first resonators is different from a second center frequency of the plurality of second resonators, and a third center frequency of the plurality of third resonators is different from the first center frequency and the second center frequency.

Each of the plurality of first resonators, the plurality of second resonators, and the plurality of third resonators may have a rectangular shape.

Each of the plurality of first resonators may have a first length, each of the plurality of second resonators has a second length, and each of the plurality of third resonators has a third length, and wherein the first length, the second length, and the third length are different from one another.

Each of the plurality of first resonators, the plurality of second resonators, and the plurality of third resonators may include three resonators having a same center frequency.

Each of the plurality of multi resonators may include: a center resonator; a first adjacent resonator arranged adjacent to a first side of the center resonator, and a second adjacent resonator arranged adjacent to a second side of the center resonator, wherein the center resonator, the first adjacent resonator, and the second adjacent resonator all have a same center frequency.

The center resonator, the first adjacent resonator, and the second adjacent resonator may be arranged in a substantially flat plane without overlapping each other.

Each of the center resonator, the first adjacent resonator, and the second adjacent resonator may have a rectangular shape.

The center resonator may have a first length and a first width, and each of the first adjacent resonator and the second adjacent resonator has a second length and a second width, wherein the first length is less than the second length, and wherein the first width is greater than the second width.

Each of the plurality of multi resonators may include: a center resonator; and U-shaped adjacent resonators surrounding the center resonator, wherein the center resonator and the adjacent resonators have a same center frequency.

The center resonator and the U-shaped adjacent resonators may be arranged in a substantially flat plane without overlapping each other.

A number of the U-shaped adjacent resonators may be two.

Each of the plurality of multi resonators may include: a T-shaped center resonator; a first adjacent resonator arranged adjacent to a first side of the T-shaped center resonator, and a second adjacent resonator arranged adjacent to a second side of the T-shaped center resonator, wherein the T-shaped center resonator and the first and second adjacent resonators have a same center frequency.

The T-shaped center resonator and the first and second adjacent resonators may be arranged in a substantially flat plane without overlapping each other.

A length of each of the first and second adjacent resonators may be less than a length of the T-shaped center resonator.

BRIEF DESCRIPTION OF THE DRAWINGS

These and/or other exemplary aspects and advantages will become apparent and more readily appreciated from the following description of the exemplary embodiments, taken in conjunction with the accompanying drawings in which.

DETAILED DESCRIPTION

Figure 1:
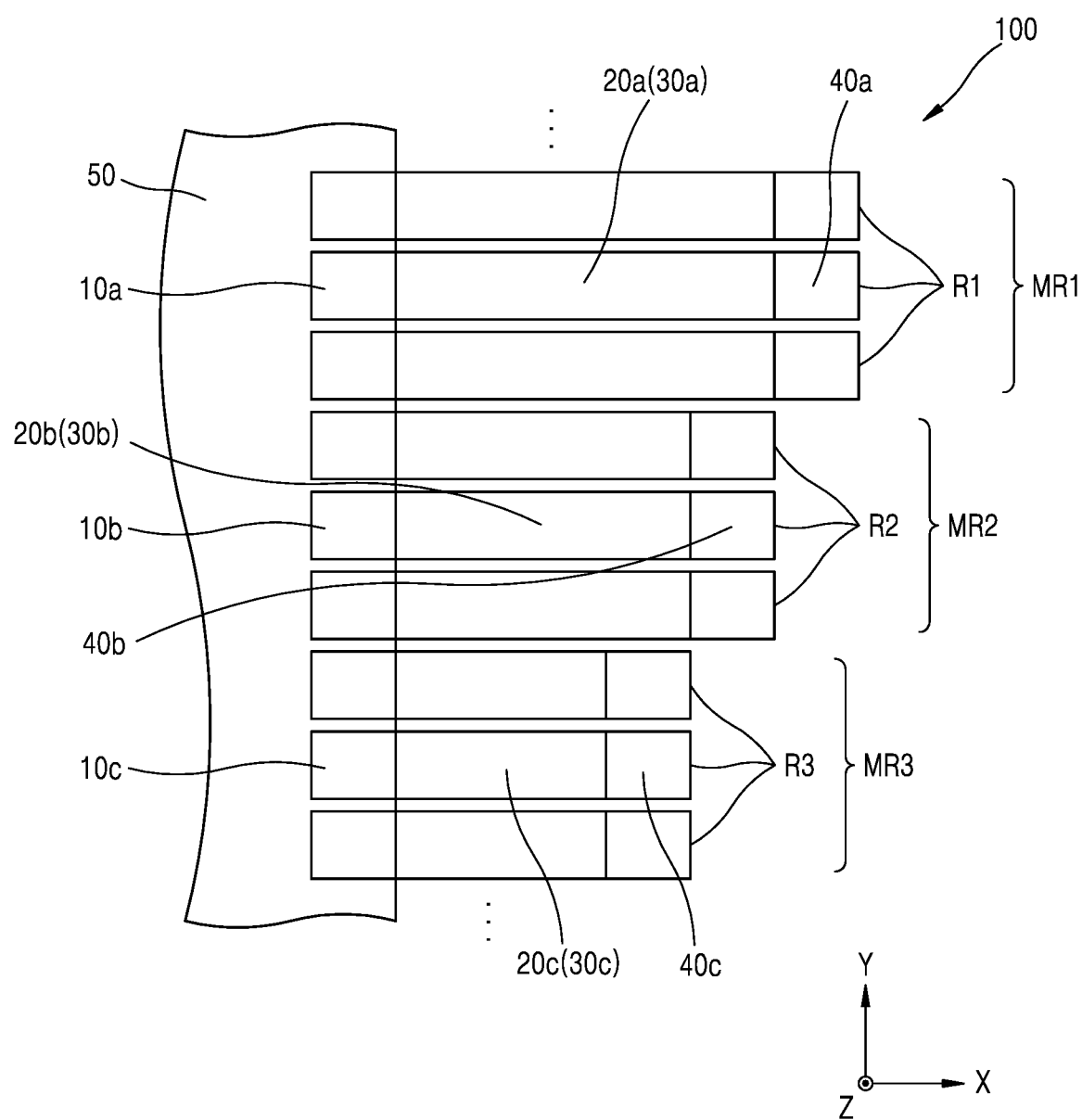
FIG. 1 is a plan view illustrating a schematic configuration of a multi resonator system according to an exemplary embodiment.

Reference will now be made in detail to embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain various aspects.

It will be understood that when a layer, region, or component is referred to as being "formed on," another layer, region, or component, it can be directly or indirectly formed on the other layer, region, or component.

As used herein, the singular forms "a," "an" and "the" are intended to include the plural forms as well, unless the context clearly indicates otherwise. It will be further understood that the terms "comprises" and/or "comprising" used herein specify the presence of stated features or components, but do not preclude the presence or addition of one or more other features or components.

As used herein, the term "the" or similar indicative terms correspond to both the singular form and the plural form.

Operations constituting a method may be performed in an appropriate order, unless operations clearly indicate otherwise. The method is not limited to the order of operations described herein. The use of any and all examples, or exemplary language (e.g., "such as") provided herein, is intended merely to better illuminate the underlying concept and does not pose a limitation on the scope of the disclosure.

FIG. 1 is a plan view illustrating a schematic configuration of a multi resonator system 100 according to an exemplary embodiment.

Referring to FIG. 1, the multi resonator system 100 may include a support substrate 50 and a plurality of multi resonators MR1, MR2, and MR3.

The support substrate 50 may include any of various materials such as silicon, for example. One end of each of the plurality of multi resonators MR1, MR2, and MR3 is fixed to the support substrate 50 and may include any of various materials such as silicon, for example.

The plurality of multi resonators MR1, MR2, and MR3 may include a first multi resonator MR1, a second multi resonator MR2, and a third multi resonator MR3. One end of each of the plurality of multi resonators MR1, MR2, and MR3 is fixed to the support substrate 50.

The first multi resonator MR1 may include a plurality of first resonators R1, each having the same center frequency. The second multi resonator MR2 may include a plurality of second resonators R2, each having the same center frequency. The third multi resonator MR3 include a plurality of third resonators R3, each having the same center frequency. The center frequencies of the plurality of multi resonators MR1, MR2, and MR3 may be different from one another. For example, the center frequency of the plurality of first resonators R1 of the first multi resonator MR1 may be $f_1$, the center frequency of the plurality of second resonators R2 of the second multi resonator MR2 may be $f_2$, and the center frequency of the plurality of third resonators R3 of the third multi resonator MR3 may be $f_3$. The center frequency may be a frequency at which a displacement of each of the resonators R1, R2, and R3 is maximized.

The each of plurality of resonators R1, R2, and R3 may respectively include a fixer 10a, 10b, and 10c fixed to the support substrate 50, a driver 30a, 30b, and 30c driven in response to signals, and a sensor 20a, 20b, and 20c sensing movements of the drivers 30a, 30b, and 30c. Also, each of the plurality of resonators R1, R2, and R3 may further respectively include a mass body 40a, 40b, and 40c for providing a predetermined mass to the respective driver 30a, 30b, and 30c. This will be described in detail below.

The plurality of resonators R1, R2, and R3 may be arranged in a substantially flat plane without overlapping each other. That is, the plurality of resonators R1, R2, and R3 may be arranged to be simultaneously exposed to a physical signal input path as a whole.

Each of the plurality of multi resonators MR1, MR2, and MR3 may include a plurality of resonators. For example, each of the plurality of multi resonators MR1, MR2, and MR3 may include the three resonators R1, R2, and R3. That is, the first multi resonator MR1 may include the three first resonators R1, the second multi resonator MR2 may include the three second resonators R2, and the third multi resonator MR3 may include the three third resonators R3 but the present disclosure is not limited thereto. Also, spaces between adjacent resonators may be several micrometers.

Each of the first resonators R1, the second resonators R2, and the third resonators R3 may have a rectangular shape. The first resonators R1, the second resonators R2, and the third resonators R3 may have different center frequencies and different lengths. For example, lengths of the second resonators R2 may be less than lengths of the first resonators R1, and lengths of the third resonators R3 may be less than lengths of the second resonators R2, as shown in FIG. 1.

Figure 2:
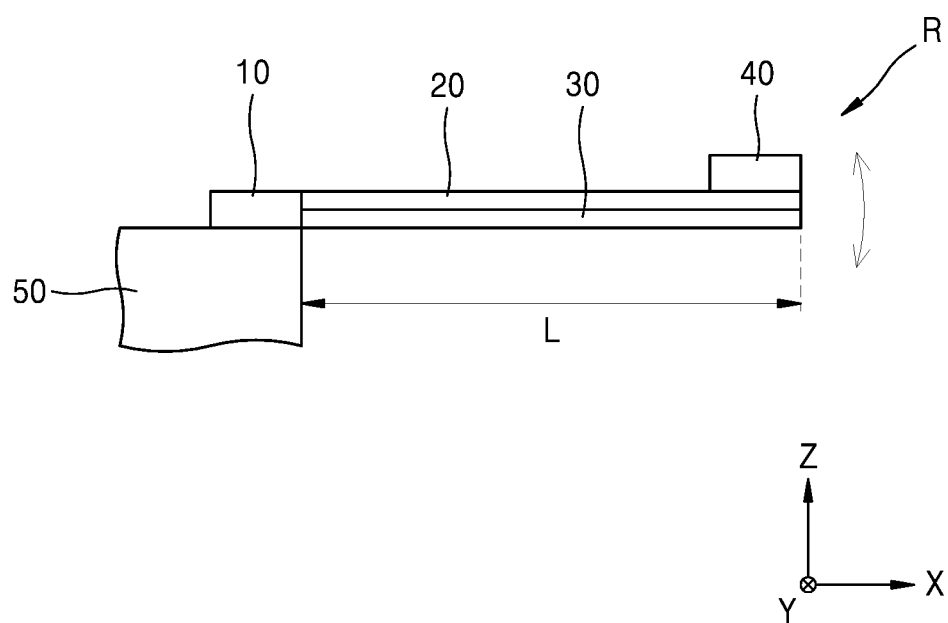
FIG. 2 is a cross-sectional view illustrating a detailed structure of a resonator included in the multi resonator system of FIG. 1 according to an exemplary embodiment.

FIG. 2 is a cross-sectional view illustrating a detailed structure of a resonator R included in the multi resonator system 100 of FIG. 1.

Referring to FIG. 2, the resonator R may include a fixer 10 fixed to the support substrate 50, a driver 30 driven in response to a signal, and a sensor 20 sensing a movement of the driver 30. Also, the resonator R may further include a mass body 40 for providing a predetermined mass to the driver 30.

The driver 30 may include an elastic film. The elastic film may have a length of L and a width of W (not shown), which, together with mass m of the mass body 40, are factors for determining the resonance characteristics of the resonator R. The elastic film may include silicon, a metal, or a polymer.

The sensor 20 may include a sensor layer configured to sense a movement of the driver 30. The sensor 20 may include, for example, a piezoelectric element. In this case, the sensor 20 may have a structure in which an electrode layer, a piezoelectric material layer, and an electrode layer are stacked. ZnO, SnO, PZT, $ZnSnO_3$, polyvinylidene fluoride (PVDF), poly(vinylidene fluoride-trifluoroethylene) (P(VDF-TrFE)), AN, or PMN-PT may be used as the piezoelectric material. A metal material or any of various conductive materials may be used to form the electrode layer.

The resonator R may have a width of several micrometers or less, a thickness of several micrometers or less, and a length of several millimeters or less. Such a resonators R, having these ultra-small sizes, may be manufactured by a microelectromechanical system (MEMS) process.

The resonator R may vertically vibrate along a Z direction in response to an external signal, and a displacement value z may be determined according to the following motion equation:

$$m\frac{d^2z}{dt^2} + c\frac{dz}{dt} + kz = F_0\cos\omega t$$

wherein m denotes a mass of the mass body 40, c denotes a damping coefficient, k denotes the modulus of elasticity, and $F_0 \cos \omega t$ denotes a driving force and indicates an action caused by a signal input to the resonator R. The value of k may be determined by the physical properties and the shape of the driver 30.

According the motion equation, the resonator R may show a frequency response characteristic having a center frequency $f_0$.

The center frequency $f_0$ is as follows:

$$f_0 = \frac{1}{2\pi}\sqrt{\frac{k}{m}}$$

As described above, the plurality of resonators R1, R2, and R3 included in the multi resonator system 100 may be designed to have different center frequencies and may sense a frequency of a certain band with respect to the center frequency $f_0$.

Figure 3A:
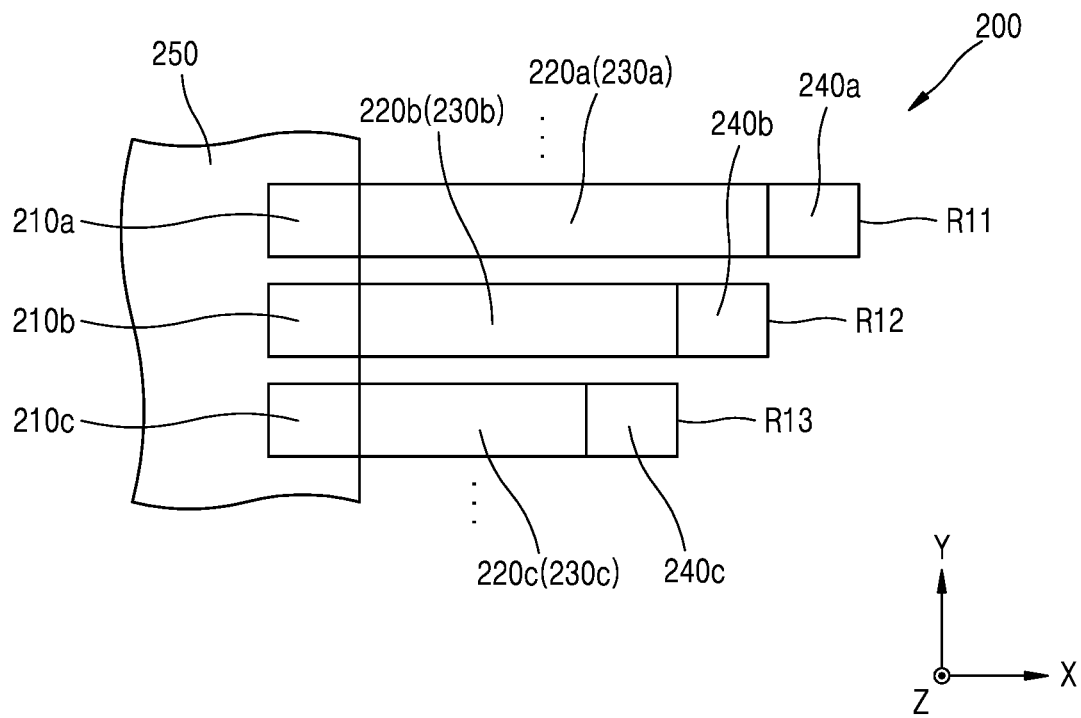
FIG. 3A is a plan view illustrating a schematic configuration of a conventional multi resonator system.
Figure 3B:
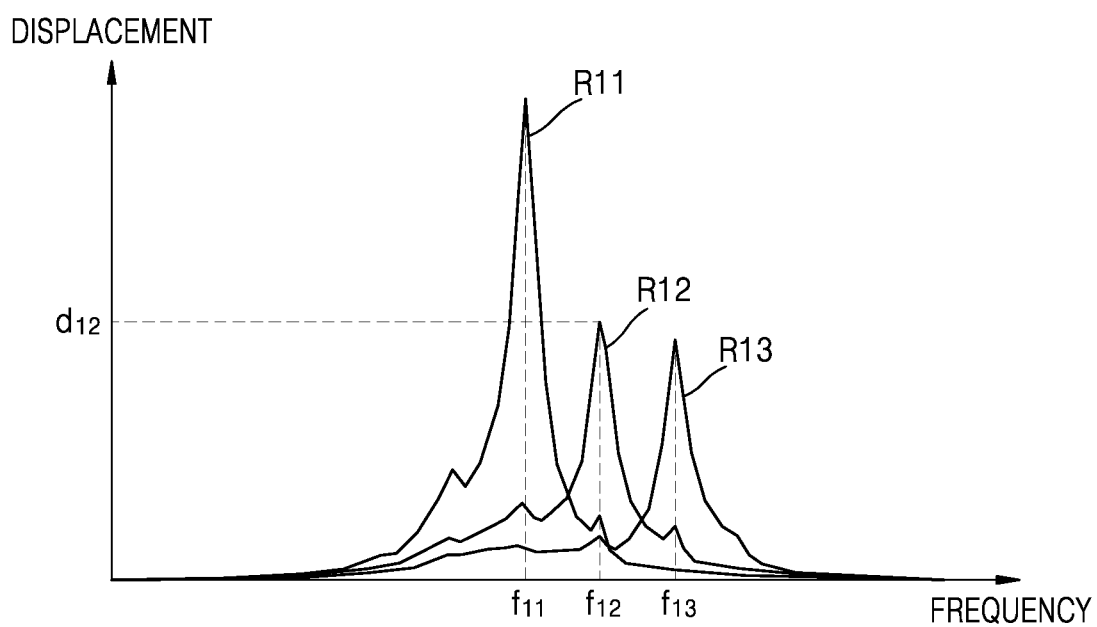
FIG. 3B is a graph showing a displacement of each resonator with respect to frequency in the conventional multi resonator system of FIG. 3A.

FIG. 3A is a plan view illustrating a schematic configuration of a related art multi resonator system 200. FIG. 3B is a graph showing a displacement of each of resonators R11, R12, and R13 with respect to a frequency in the multi resonator system 200 of FIG. 3A.

Referring to FIG. 3A, the multi resonator system 200 may include a support substrate 250 and the plurality of resonators R11, R12, and R13 having different center frequencies.

The plurality of resonators R11, R12, and R13 may respectively include fixers 210a, 210b, and 210c fixed to the support substrate 250, drivers 230a, 230b, and 230c driven in response to signals, and sensors 220a, 220b, and 220c sensing movements of the drivers 230a, 230b, and 230c. Also, the plurality of resonators R11, R12, and R13 may further include mass bodies 240a, 240b, and 240c for providing a predetermined mass to the drivers 230a, 230b, and 230c, respectively. The support substrate 250, the fixers 210a, 210b, and 210c, the drivers 230a, 230b, and 230c, the sensors 220a, 220b, and 220c, and the mass bodies 240a, 240b, and 240c may be similar to the support substrate 50, the fixers 10a, 10b, and 10c, the drivers 30a, 30b, and 30c, the sensors 20a, 20b, and 20c, and the mass bodies 40a, 40b, and 40c described with reference to FIG. 2, and thus detailed descriptions thereof will not be repeated here.

The plurality of resonators R11, R12, and R13 may have different center frequencies. For example, a center frequency of the first resonator R11 may be $f_{11}$, a center frequency of the second resonator R12 may be $f_{12}$, and a center frequency of the third resonator R13 may be $f_{13}$.

Referring to FIG. 3B, the first resonator R11 may have a maximum displacement at the center frequency $f_{11}$, the second resonator R12 may have a maximum displacement at the center frequency $f_{12}$, and the third resonator R13 may have a maximum displacement at the center frequency $f_{13}$.

Also, the resonators R11, R12, and R13 may respond to frequencies of adjacent bands, in addition to the center frequencies $f_{11}$, $f_{12}$, and $f_{13}$. Since the plurality of resonators R11, R12, and R13 are integrated within a limited space, crosstalk may occur due to coupling between the resonators R11, R12, and R13. With respect to a displacement of the first resonator R11 with respect to frequency, since the center frequency of the first resonator R11 is $f_{11}$, the first resonator R11 may have the greatest displacement at $f_{11}$, and a displacement peak may occur at $f_{12}$ that is the center frequency of the second resonator R12 that is adjacent to the first resonator R11. Also, with respect to a displacement of the second resonator R12 with respect to frequency, since the center frequency of the second resonator R12 is $f_{12}$, the second resonator R12 may have the greatest displacement at $f_{12}$, and displacement peaks may occur at $f_{11}$ and $f_{13}$ that are the center frequencies of the first resonator R11 and the third resonator R13, respectively, that are adjacent to the second resonator R12. Also, with respect to a displacement of the third resonator R13 with respect to frequency, since the center frequency of the third resonator R13 is $f_{13}$, the third resonator R13 may have the greatest displacement at $f_{13}$, and a displacement peak may occur at $f_{12}$ that is the center frequency of the second resonator R12 that is adjacent to the third resonator R13.

Figure 4A:
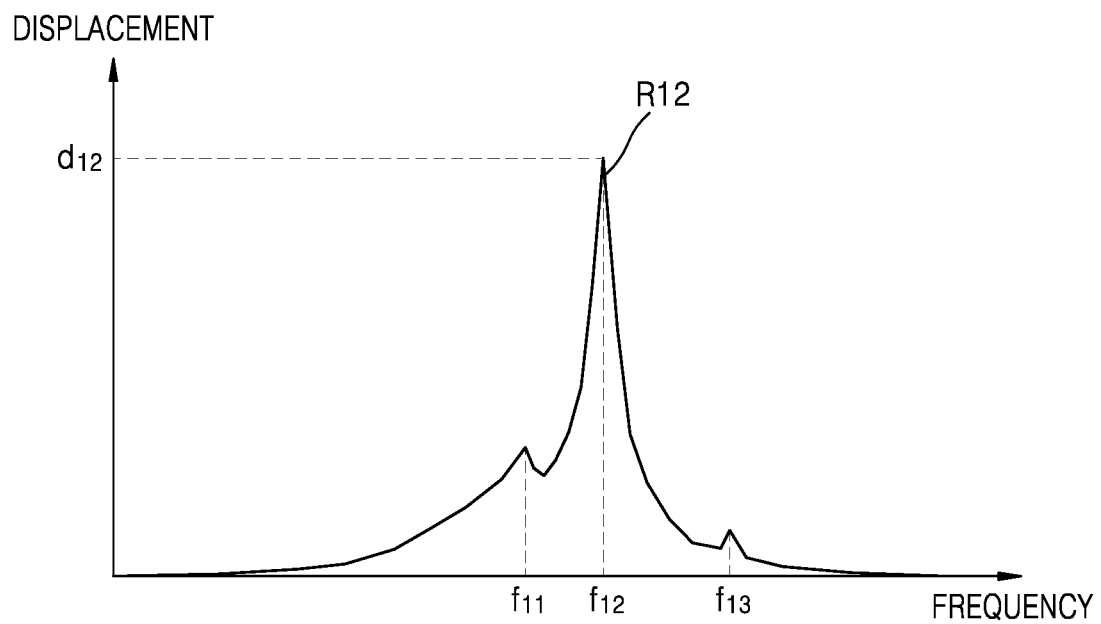
FIG. 4A is a graph showing a displacement of a resonator with respect to frequency in the conventional multi resonator system of FIG. 3A.

FIG. 4A is a graph showing a displacement of the resonator R12 with respect to a frequency in the multi resonator system 200 of FIG. 3A.

With respect to the displacement of the resonator R12 of the multi resonator system 200 with respect to the frequency, since a center frequency of the second resonator R12 is $f_{12}$, the second resonator R12 may have a greatest displacement $d_{12}$ at $f_{12}$. Also, displacement peaks may occur at $f_{11}$ and $f_{13}$ that are center frequencies of the first resonator R11 and the third resonator R13 that are adjacent to the second resonator R12. As described above, a peak may occur at a frequency, other than a center frequency of a resonator, due to coupling between adjacent resonators, and thus the peaks occurring at $f_{11}$ and $f_{13}$ may be unnecessary signals to the second resonator R12.

Figure 4B:
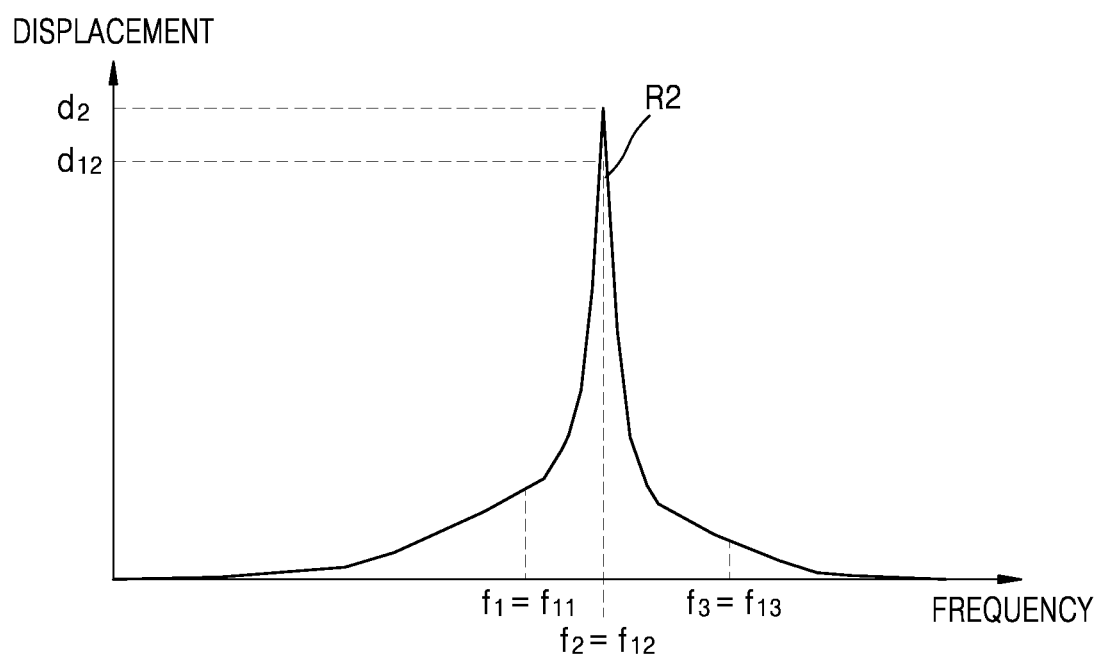
FIG. 4B is a graph showing a displacement of a center resonator among a plurality of second resonators of a second multi resonator with respect to frequency in the multi resonator system of FIG. 1, according to an exemplary embodiment.

FIG. 4B is a graph showing a displacement of a center resonator among the plurality of second resonators R2 of the second multi resonator MR2 with respect to a frequency in the multi resonator system 100 of FIG. 1.

Referring to FIG. 4B, $f_2$ is a center frequency of the second resonator R2 and may be similar to $f_{12}$ that is a center frequency of the second resonator R12 of the resonator system 200 of FIG. 3A. Also, $f_1$ is a center frequency of the first resonator R1 of the first multi resonator MR1 of the multi resonator system 100 and may be similar to $f_{11}$ that is a center frequency of the first resonator R11 of the resonator system 200. Also, $f_3$ is a center frequency of the third resonator R3 of the third multi resonator MR3 of the multi resonator system 100 and may be similar to $f_{13}$ that is a center frequency of the third resonator R13 of the resonator system 200. That is, the first resonator R1 of the first multi resonator MR1 and the first resonator R11 of the resonator system 200 may have the same shape and include the same material, the second resonator R2 of the second multi resonator MR2 and the second resonator R12 of the resonator system 200 may have the same shape and include the same material, and the third resonator R3 of the third multi resonator MR3 and the third resonator R13 of the resonator system 200 may have the same shape and include the same material.

The second resonator R2 may have a greatest displacement at the center frequency $f_2$. Referring to FIG. 1, the second resonators R2 having the same center frequency may be disposed both sides of a center resonator among the plurality of second resonators R2 of the second multi resonator MR2 of the multi resonator system 100. Thus, coupling may occur in the centered second resonator R2 by the adjacent second resonators R2, and a displacement may increase from $d_{12}$ to $d_2$ at the center frequency $f_2$ of the second resonator R2. Accordingly, in the multi resonator system 100 according to an exemplary embodiment, as a resonance displacement increases at a center frequency, an output signal may also increase at the center frequency, and sensitivity of the multi resonator system 100 may be enhanced.

Also, referring to FIG. 1, since the center resonator among the plurality of second resonators R2 of the second multi resonator MR2 are adjacent to the second resonators R2 having the same center frequency, coupling by the first resonator R having a different center frequency from the second resonator R2 and the second resonator R2 may be reduced in the center resonator. Thus, referring to FIG. 4B, a displacement peak may not occur at $f_1$ that is the center frequency of the first resonator R1 and at $f_2$ that is the center frequency of the second resonator R2. As described above, the multi resonator system 100 according to an exemplary embodiment may reduce the crosstalk effect due to coupling between other adjacent resonators having different center frequencies.

Also, each of a plurality of multi resonators of the multi resonator system 100 may include a plurality of resonators, and thus an increased output signal may be obtained at each center frequency.

Figure 5:
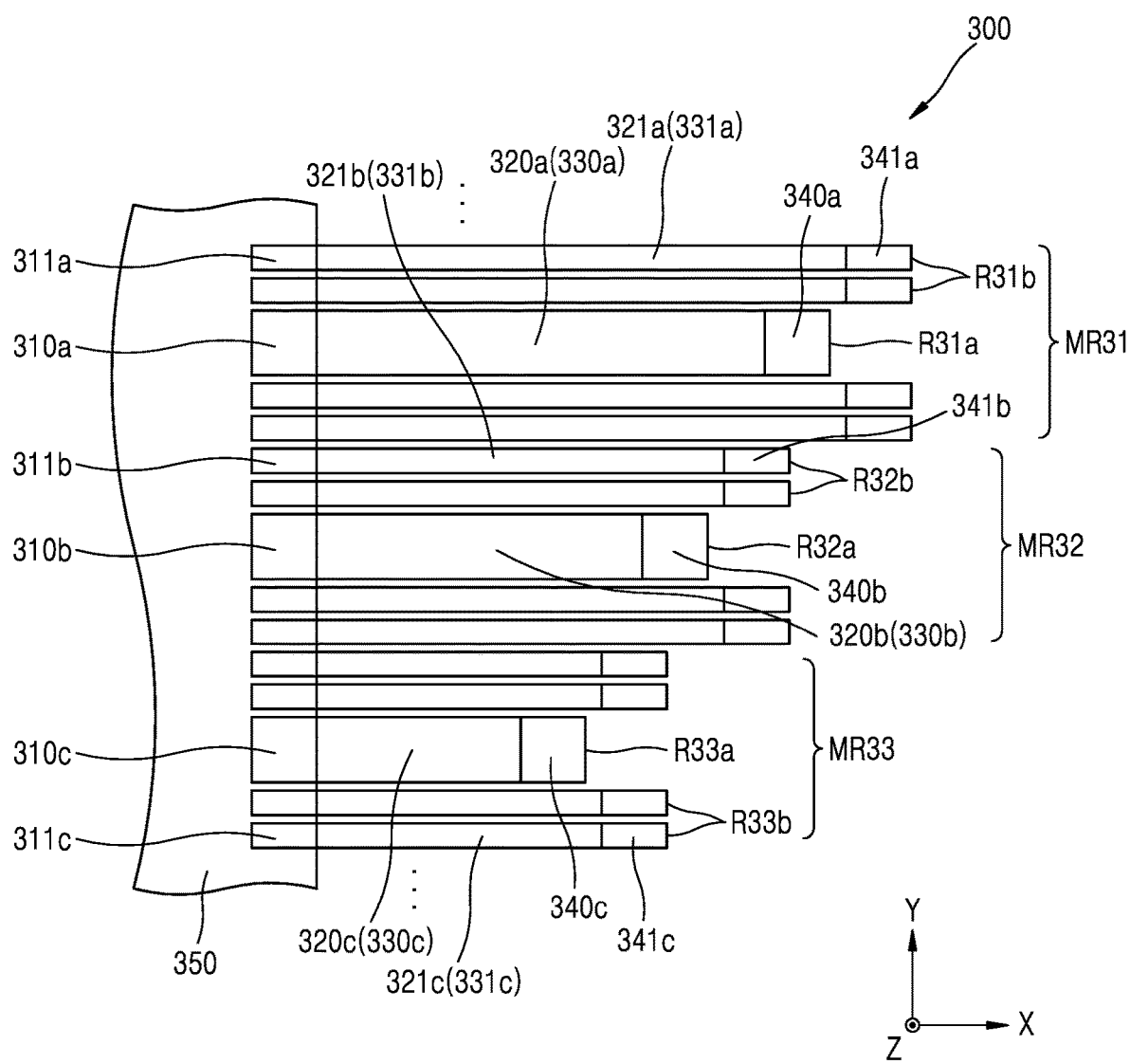
FIG. 5 is a plan view illustrating a schematic configuration of a multi resonator system according to another exemplary embodiment.

FIG. 5 is a plan view illustrating a schematic configuration of a multi resonator system 300 according to another exemplary embodiment.

Referring to FIG. 5, the multi resonator system 300 may include a support substrate 350 and a plurality of multi resonators MR31, MR32, and MR33.

The support substrate 350 to which one end of each of the plurality of multi resonators MR31, MR32, and MR33 is fixed may include any of various materials such as silicon, etc.

The plurality of multi resonators MR31, MR32, and MR33 may include a first multi resonator MR31, a second multi resonator MR32, and a third multi resonator MR33. One end of each of the plurality of multi resonators MR31, MR32, and MR33 is fixed to the support substrate 350.

Also, the first multi resonator MR31, the second multi resonator MR32, and the third multi resonator MR33 may have different center frequencies.

The plurality of multi resonators MR31, MR32, and MR33 may respectively include center resonators R31a, R32a, and R33a and adjacent resonators R31b, R32b, and R33b that are arranged adjacent to both sides of the center resonators R31a, R32a, and R33a, respectively. In each of the plurality of multi resonators MR31, MR32, and MR33, the center resonators R31a, R32a, and R33a and the adjacent resonators R31b, R32b, and R33b may have the same center frequency. Also, the center resonators R31a, R32a, and R33a and the adjacent resonators R31b, R32b, and R33b may be arranged in a substantially flat plane without overlapping each other and may have rectangular shapes. Also, each two of the adjacent resonators R31b, R32b, and R33b may be arranged adjacent to both sides of the center resonators R31a, R32a, and R33a, respectively.

The center resonators R31a, R32a, and R33a may respectively include fixers 310a, 310b, and 310c fixed to the support substrate 350, drivers 330a, 330b, and 330c driven in response to signals, and sensors 320a, 320b, and 320c sensing movements of the drivers 330a, 330b, and 330c. Also, the center resonators R31a, R32a, and R33a may further include mass bodies 340a, 340b, and 340c for providing a predetermined mass to the drivers 330a, 330b, and 330c, respectively. The support substrate 350, the fixers 310a, 310b, and 310c, the drivers 330a, 330b, and 330c, the sensors 320a, 320b, and 320c, and the mass bodies 340a, 340b, and 340c may be similar to the support substrate 50, the fixers 10a, 10b, and 10c, the drivers 30a, 30b, and 30c, the sensors 20a, 20b, and 20c, and the mass bodies 40a, 40b, and 40c described with reference to FIG. 2, and thus detailed descriptions thereof will not be repeated here.

The adjacent resonators R31b, R32b, and R33b may respectively include fixers 311a, 311b, and 311c fixed to the support substrate 350, drivers 331a, 331b, and 331c driven in response to signals, and sensors 321a, 321b, and 321c sensing movements of the drivers 331a, 331b, and 331c. Also, the adjacent resonators R31b, R32b, and R33b may further include mass bodies 341a, 341b, and 341c for providing a predetermined mass to the drivers 331a, 331b, and 331c, respectively. The support substrate 350, the fixers 311a, 311b, and 311c, the drivers 331a, 331b, and 331c, the sensors 321a, 321b, and 321c, and the mass bodies 341a, 341b, and 341c may be similar to the support substrate 50, the fixers 10a, 10b, and 10c, the drivers 30a, 30b, and 30c, the sensors 20a, 20b, and 20c, and the mass bodies 40a, 40b, and 40c described with reference to FIG. 2, and thus detailed descriptions thereof will not be repeated here.

In each of the plurality of multi resonators MR31, MR32, and MR33, lengths of the center resonators R31a, R32a, and R33a may be respectively less than lengths of the adjacent resonators R31b, R32b, and R33b, and widths of the center resonators R31a, R32a, and R33a may be greater than widths of the adjacent resonators R31b, R32b, and R33b. The lengths of the center resonators R31a, R32a, and R33a and the adjacent resonators R31b, R32b, and R33b may present a size of a resonator in an X axis direction of FIG. 5, and the widths of the adjacent resonators R31b, R32b, and R33b. The lengths of the center resonators R31a, R32a, and R33a and the adjacent resonators R31b, R32b, and R33b may present a size of a resonator in a Y axis direction of FIG. 5. Thus, in each of the plurality of multi resonators MR31, MR32, and MR33, the center resonators R31a, R32a, and R33a and the adjacent resonators R31b, R32b, and R33b may have the same center frequencies.

The multi resonator system 300 according to the present exemplary embodiment may include the center resonators R31a, R32a, and R33a and the adjacent resonators R31b, R32b, and R33b that have the same center frequencies, and thus a resonance range in the center frequencies of the center resonators R31a, R32a, and R33a may be enhanced. Also, a crosstalk effect due to coupling between resonators having different center frequencies may be reduced owing to the adjacent resonators R31b, R32b, and R33b arranged adjacent to both sides of the center resonators R31a, R32a, and R33a, respectively.

Figure 6:
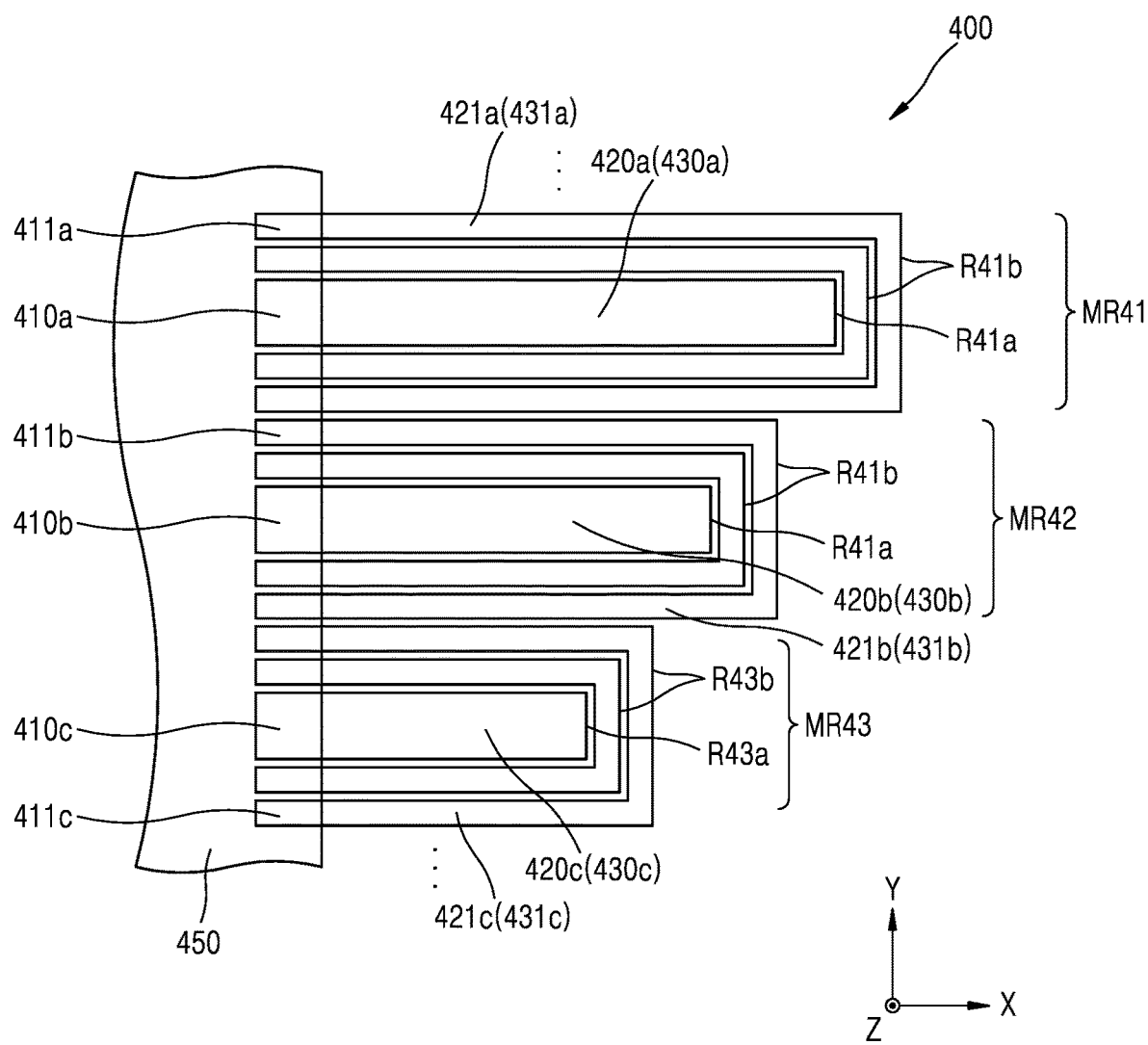
FIG. 6 is a plan view illustrating a schematic configuration of a multi resonator system according to another exemplary embodiment.

FIG. 6 is a plan view illustrating a schematic configuration of a multi resonator system 400 according to another exemplary embodiment.

Referring to FIG. 6, the multi resonator system 400 may include a support substrate 450 and a plurality of multi resonators MR41, MR42, and MR43.

The support substrate 450 to which one end of each of the plurality of multi resonators MR41, MR42, and MR43 is fixed may include any of various materials such as silicon, etc.

The plurality of multi resonators MR41, MR42, and MR43 may include a first multi resonator MR41, a second multi resonator MR42, and a third multi resonator MR43. One end of each of the plurality of multi resonators MR41, MR42, and MR43 is fixed to the support substrate 450.

Also, the first multi resonator MR41, the second multi resonator MR42, and the third multi resonator MR43 may have different center frequencies.

The plurality of multi resonators MR41, MR42, and MR43 may respectively include center resonators R41a, R42a, and R43a and U-shaped adjacent resonators R41b, R42b, and R43b that surround the center resonators R41a, R42a, and R43a, respectively. In each of the plurality of multi resonators MR41, MR42, and MR43, the center resonators R41a, R42a, and R43a and the adjacent resonators R41b, R42b, and R43b may have the same center frequency. Also, the center resonators R41a, R42a, and R43a and the adjacent resonators R41b, R42b, and R43b may be arranged in a substantially flat plane without overlapping each other. The center resonators R31a, R41a, R42a, and R43a may have rectangular shapes. Each two of the adjacent resonators R41b, R42b, and R43b may be arranged to surround the center resonators R41a, R42a, and R43a, respectively.

The center resonators R41a, R42a, and R43a may respectively include fixers 410a, 410b, and 410c fixed to the support substrate 450, drivers 430a, 430b, and 430c driven in response to signals, and sensors 420a, 420b, and 420c sensing movements of the drivers 430a, 430b, and 430c. Also, each of the center resonators R41a, R42a, and R43a may further include a mass body (not shown) for providing a predetermined mass to the drivers 430a, 430b, and 430c. The support substrate 450, the fixers 410a, 410b, and 410c, the drivers 430a, 430b, and 430c, the sensors 420a, 420b, and 420c, and the mass body may be similar to the support substrate 50, the fixers 10a, 10b, and 10c, the drivers 30a, 30b, and 30c, the sensors 20a, 20b, and 20c, and the mass bodies 40a, 40b, and 40c described with reference to FIG. 2, and thus detailed descriptions thereof will not be repeated here.

The adjacent resonators R41b, R42b, and R43b may respectively include fixers 411a, 411b, and 411c fixed to the support substrate 450, drivers 431a, 431b, and 431c driven in response to signals, and sensors 421a, 421b, and 421c sensing movements of the drivers 431a, 431b, and 431c. Also, each of the adjacent resonators R41b, R42b, and R43b may further include a mass body (not shown) for providing a predetermined mass to the drivers 431a, 431b, and 431c. The support substrate 450, the fixers 411a, 411b, and 411c, the drivers 431a, 431b, and 431c, the sensors 421a, 421b, and 421c, and the mass body may be similar to the support substrate 50, the fixers 10a, 10b, and 10c, the drivers 30a, 30b, and 30c, the sensors 20a, 20b, and 20c, and the mass bodies 40a, 40b, and 40c described with reference to FIG. 2, and thus detailed descriptions thereof will not be repeated here.

The multi resonator system 400 according to the present exemplary embodiment may include the center resonators R41a, R42a, and R43a and the adjacent resonators R41b, R42b, and R43b that have the same center frequencies, and thus a resonance range in the center frequencies of the center resonators R41a, R42a, and R43a may be enhanced. Also, a crosstalk effect caused by a coupling between resonators having different center frequencies may be reduced owing to the adjacent resonators R41b, R42b, and R43b arranged adjacent to both sides of the center resonators R41a, R42a, and R43a, respectively.

Figure 7:
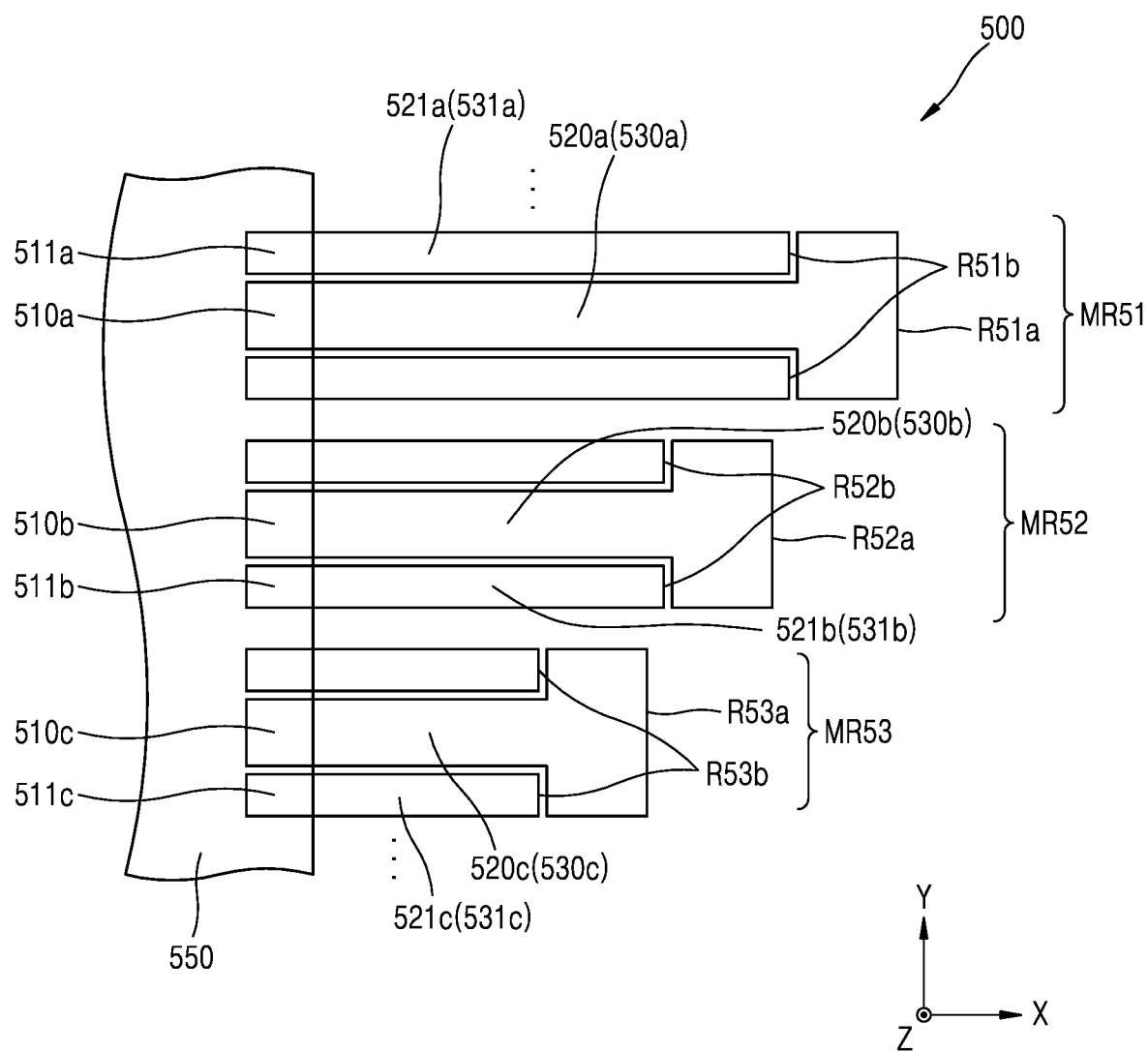
FIG. 7 is a plan view illustrating a schematic configuration of a multi resonator system according to another exemplary embodiment.

FIG. 7 is a plan view illustrating a schematic configuration of a multi resonator system 500 according to another exemplary embodiment.

Referring to FIG. 7, the multi resonator system 500 may include a support substrate 550 and a plurality of multi resonators MR51, MR52, and MR53.

The support substrate 550 to which one end of each of the plurality of multi resonators MR51, MR52, and MR53 is fixed may include any of various materials such as silicon, for example.

The plurality of multi resonators MR51, MR52, and MR53 may include a first multi resonator MR51, a second multi resonator MR52, and a third multi resonator MR53. One end of each of the plurality of multi resonators MR51, MR52, and MR53 is fixed to the support substrate 550.

Also, the first multi resonator MR51, the second multi resonator MR52, and the third multi resonator MR53 may have different center frequencies.

The plurality of multi resonators MR51, MR52, and MR53 may respectively include T-shaped center resonators R51a, R52a, and R53a and adjacent resonators R51b, R52b, and R53b that are arranged adjacent to both sides of the center resonators R51a, R52a, and R53a, respectively. In each of the plurality of multi resonators MR51, MR52, and MR53, the center resonators R51a, R52a, and R53a and the adjacent resonators R51b, R52b, and R53b may have the same center frequency. Also, the center resonators R51a, R52a, and R53a and the adjacent resonators R51b, R52b, and R53b may be arranged in a substantially flat plane without overlapping each other. Lengths of the adjacent resonators R51b, R52b, and R53b in an X axis direction may be less than lengths of the center resonators R51a, R52a, and R53a in the X axis direction, as shown in FIG. 7. Each of the adjacent resonators R51b, R52b, and R53b may be arranged adjacent to both sides of the center resonators R51a, R52a, and R53a, respectively. Thus, each of the plurality of multi resonators MR51, MR52, and MR53 may have a rectangular shape as a whole.

The center resonators R51a, R52a, and R53a may respectively include fixers 510a, 510b, and 510c fixed to the support substrate 550, drivers 530a, 530b, and 530c driven in response to signals, and sensors 520a, 520b, and 520c sensing movements of the drivers 530a, 530b, and 530c. Also, each of the center resonators R51a, R52a, and R53a may further include a mass body (not shown) for providing a predetermined mass to the drivers 530a, 530b, and 530c. The support substrate 550, the fixers 510a, 510b, and 510c, the drivers 530a, 530b, and 530c, the sensors 520a, 520b, and 520c, and the mass body may be similar to the support substrate 50, the fixers 10a, 10b, and 10c, the drivers 30a, 30b, and 30c, the sensors 20a, 20b, and 20c, and the mass bodies 40a, 40b, and 40c described with reference to FIG. 2, and thus detailed descriptions thereof will not be repeated here.

The adjacent resonators R51b, R52b, and R53b may respectively include fixers 511a, 511b, and 511c fixed to the support substrate 550, drivers 531a, 531b, and 531c driven in response to signals, and sensors 521a, 521b, and 521c sensing movements of the drivers 531a, 531b, and 531c. Also, each of the adjacent resonators R51b, R52b, and R53b may further include a mass body (not shown) for providing a predetermined mass to the drivers 531a, 531b, and 531c. The support substrate 550, the fixers 511a, 511b, and 511c, the drivers 531a, 531b, and 531c, the sensors 521a, 521b, and 521c, and the mass body may be similar to the support substrate 50, the fixers 10a, 10b, and 10c, the drivers 30a, 30b, and 30c, the sensors 20a, 20b, and 20c, and the mass bodies 40a, 40b, and 40c described with reference to FIG. 2, and thus detailed descriptions thereof will not be repeated here.

The multi resonator system 500 according to the present exemplary embodiment may include the center resonators R51a, R52a, and R53a and the adjacent resonators R51b, R52b, and R53b that have the same center frequencies, and thus a resonance range in the center frequencies of the center resonators R51a, R52a, and R53a may be enhanced. Also, a crosstalk effect caused by a coupling between resonators having different center frequencies may be reduced owing to the adjacent resonators R51b, R52b, and R53b arranged adjacent to both sides of the center resonators R51a, R52a, and R53a, respectively.

According to any of the above-described exemplary embodiments of a multi resonator system, since each of a plurality of different multi resonators included in the multi resonator system may include a plurality of resonators having the same center frequency, a resonance displacement may be enhanced owing to coupling between adjacent resonators having the same center frequency.

Also, according to any of the above-described exemplary embodiments of a multi resonator system, each of the plurality of multi resonators may include the plurality of resonators having the same center frequency, a crosstalk effect caused by coupling between resonators having different center frequencies in a center resonator of each of the multi resonators may be reduced.

Also, according to any of the above-described exemplary embodiments of a multi resonator system, each of the plurality of multi resonators may include the plurality of resonators having the same center frequency, each of the plurality of multi resonators may obtain an increased output signal at a center frequency.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A multi resonator system comprising:
   a support substrate; and
   a plurality of multi resonators, wherein a first center frequency of a first multi resonator of the plurality of multi resonators is different from a second center frequency of a second multi resonator of the plurality of multi resonators,
   wherein each of the plurality of multi resonators comprises a plurality of resonators having a same center frequency, and each of the plurality of resonators comprises a first end fixed to the support substrate,
   wherein each of the plurality of multi resonators comprises:
   a center resonator;
   a first adjacent resonator adjacent to a first side of the center resonator, and
   a second adjacent resonator adjacent to a second side of the center resonator,
   wherein a center frequency of the center resonator is the same as a center frequency of the first adjacent resonator and a center frequency of the second adjacent resonator, and
   wherein the center resonator of one multi resonator of the plurality of multi resonators and the center resonator of another multi resonator of the plurality of multi resonators are spaced apart from each other by respective adjacent resonators therebetween.

2. The multi resonator system of claim 1, wherein each of the plurality of resonators comprises:
   a fixer fixed to the support substrate;
   a driver configured to be driven in response to an audio signal; and
   a sensor configured to sense a movement of the driver.

3. The multi resonator system of claim 2, wherein each of the plurality of resonators further comprises a mass body.

4. The multi resonator system of claim 1, wherein the plurality of resonators are arranged in a substantially flat plane without overlapping each other.

5. The multi resonator system of claim 1, wherein the plurality of multi resonators comprise the first multi resonator, the second multi resonator, and a third multi resonator,
   wherein the first multi resonator comprises a plurality of first resonators, the second multi resonator comprises a plurality of second resonators, and the third multi resonator comprises a plurality of third resonators, and
   wherein the plurality of first resonators have the first center frequency, the plurality of second resonators have the second center frequency, and the plurality of third resonators have a third center frequency, different from the first center frequency and the second center frequency.

6. The multi resonator system of claim 5, wherein each of the plurality of first resonators, the plurality of second resonators, and the plurality of third resonators has a rectangular shape.

7. The multi resonator system of claim 6, wherein each of the plurality of first resonators has a first length, each of the plurality of second resonators has a second length, and each of the plurality of third resonators has a third length, and
wherein the second length is different from the first length, and the third length is different from the first length and the second length.

8. The multi resonator system of claim 7, wherein the plurality of first resonators comprises three first resonators each having the first center frequency, the plurality of second resonators comprises three second resonators each having the second center frequency, and the plurality of third resonators comprises three third resonators each having the third center frequency.

9. The multi resonator system of claim 1, wherein the center resonator, the first adjacent resonator and the second adjacent resonator are arranged in a substantially flat plane without overlapping each other.

10. The multi resonator system of claim 1, wherein each of the center resonator, the first adjacent resonator and the second adjacent resonator has a rectangular shapes.

11. The multi resonator system of claim 10, wherein the center resonator has a first length and a first width, and each of the first adjacent resonator and the second adjacent resonator has a second length and a second width,
wherein the first length is less than the second length, and
wherein the first width is greater than the second width.

12. The multi resonator system of claim 11, wherein two of the first adjacent resonators are arranged adjacent to the first side of the center resonator, and two of the second adjacent resonators are arranged adjacent to the second side of the center resonator.

13. The multi resonator system of claim 1, wherein
the first adjacent resonator and the second adjacent resonator are U-shaped adjacent resonators surrounding the center resonator.

14. The multi resonator system of claim 13, wherein the center resonator and the U-shaped adjacent resonators are arranged in a substantially flat plane without overlapping each other.

15. The multi resonator system of claim 13, wherein a number of the U-shaped adjacent resonators is two.

16. The multi resonator system of claim 1, wherein
the center resonator is a T-shaped center resonator.

17. The multi resonator system of claim 16, wherein the T-shaped center resonator, the first adjacent resonator, and the second adjacent resonator are arranged in a substantially flat plane without overlapping each other.

18. The multi resonator system of claim 16, wherein a length of each of the first adjacent resonator and the second adjacent resonator is less than a length of the T-shaped center resonator.

19. A multi resonator system comprising:
a support substrate;
a first multi resonator comprising a plurality of first resonators, wherein each of the plurality of first resonators has a first center frequency and comprises a first end fixed to the support substrate; and
a second multi resonator comprising a plurality of second resonators, wherein each of the plurality of second resonators has a second center frequency, different from the first center frequency, and comprises a first end fixed to the support substrate,
wherein each of the first multi resonator and the second multi resonator comprises:
a center resonator:
a first adjacent resonator adjacent to a first side of the center resonator, and
a second adjacent resonator adjacent to a second side of the center resonator,
wherein a center frequency of the center resonator is the same as a center frequency of the first adjacent resonator and center frequency of the second adjacent resonator, and
wherein the center resonator of the first multi resonator and the center resonator of the second multi resonator are spaced apart from each other by respective adjacent resonators therebetween.

* * * * *